United States Patent
Gough

(10) Patent No.: US 6,707,340 B1
(45) Date of Patent: Mar. 16, 2004

(54) COMPENSATION TECHNIQUE AND METHOD FOR TRANSCONDUCTANCE AMPLIFIER

(75) Inventor: John James Gough, Beith (GB)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/909,068

(22) Filed: Jul. 19, 2001

Related U.S. Application Data

(60) Provisional application No. 60/227,337, filed on Aug. 23, 2000.

(51) Int. Cl.[7] .............................. H03F 3/45; G05F 1/40
(52) U.S. Cl. ........................ 330/260; 330/323; 323/273
(58) Field of Search ................................ 330/260, 292; 323/273, 280, 281, 224, 226

(56) References Cited

U.S. PATENT DOCUMENTS

| | | | |
|---|---|---|---|
| 5,331,296 A | 7/1994 | Davis | .................. 331/158 |
| 6,188,211 B1 * | 2/2001 | Rincon-Mora et al. | ..... 323/273 |
| 6,300,749 B1 * | 10/2001 | Castelli et al. | .............. 323/273 |

* cited by examiner

Primary Examiner—Khanh Van Nguyen
(74) Attorney, Agent, or Firm—Girard & Equitz LLP

(57) ABSTRACT

An amplifier circuit which includes a differential amplifier, drive circuitry for driving an output of the amplifier circuit in response to an output of the differential amplifier and frequency compensation circuitry switchable between a low current mode and a high current mode of operation. Control circuitry is provided configured to switch the frequency response circuitry between the low and high current modes in response to a magnitude of current provided to a load connected to the amplifier circuit output. In the low current mode, the frequency compensation circuitry produces a frequency response having a first pole located at a first frequency. In the high current mode, the frequency compensation circuitry produces a zero at a second frequency sufficiently close to the first frequency so as to stabilize the amplifier circuit, with the first zero being absent for the frequency response in the low current mode.

6 Claims, 2 Drawing Sheets

COMPENSATION TECHNIQUE AND METHOD FOR TRANSCONDUCTANCE AMPLIFIER

CROSS REFERENCE TO RELATED APPLICATIONS

The present application claims the benefit of the provisional application filed on Aug. 23, 2000 having application Ser. No. 60/227,337 and entitled Compensation Technique and Method for Transconductance Amplifier pursuant to 35 U.S.C.§119(e).

BACKGROUND OF THE INVENTION

1. Field of the Invention

The present invention relates generally to amplifier circuits and in particular to amplifiers having frequency compensation which permits the amplifier to remain stable while driving heavy and light loads.

2. Description of Related Art

There is an increasing demand for low cost voltage regulators having low drop out (LDO) voltage capabilities for use as a power source in battery-powered equipment and the like. FIG. 1 is a simplified schematic diagram of a conventional CMOS LDO regulator. The regulator is powered by a power source, such as a battery, which provides an input voltage Vin. A transconductance amplifier Ga is provided having a non-inverting input connected to a reference voltage Vbg typically provided by a band gap voltage reference circuit. A transconductance amplifier is typically characterized as requiring very little current, having a relatively high output impedance and having external frequency compensation.

The output of amplifier Ga is connected to the gate of a P channel PET MA which functions as the series pass element of the regulator. The source and body of transistor MA are both connected to the input voltage Vin, with the drain connected to the regulator output where output voltage Vout is produced. Resistors RA and RB are connected in series between the output of the regulator and the circuit common. The node intermediate resistors RA and RB is fed back to the non-inverting input of amplifier GA. In that transistor MA operates to invert the output of amplifier GA, the feedback path is an overall negative path such that the non-inverting input of amplifier GA is maintained at essentially the same voltage as the inverting input, namely, voltage Vbg. Thus, the voltage at the node intermediate resistors RA and RB is at voltage Vbg. Thus, the current flow through resistor RB is equal to Vbg/RB, this being the same current as through resistor RA. Thus, the voltage drop across resistor RA is equal to the RB(Vbg/RA). Voltage Vout is equal to the sum of the two voltages as follows:

$$Vout = Vbg\left(1 + \frac{RA}{RB}\right) \quad (1)$$

In R.F. applications, Vout is typically +2.8 volts.

The FIG. 1 circuit produces two poles PA and PB and a single zero ZA. The first pole PA is as follows:

$$PA = \frac{1}{(2\pi RloadCload)} \quad (2)$$

The second pole PB is a function of the output impedance Rout of amplifier GA and the gate capacitance Cgate of transistor MA as follows:

$$PB = \frac{1}{(2\pi RoutCgate)} \quad (3)$$

The zero ZA is a function of the equivalent series resistance Resr of the load capacitor and the capacitance Cload of the load capacitor and is as follows:

$$ZA = \frac{1}{(2\pi ResrCload)} \quad (4)$$

FIG. 2 is a frequency response diagram showing the relative locations of the poles PA and PB and zero ZA. The location of pole PA is a function of the load, as can be seen by equation (2) and will tend to move to a lower frequency under light load conditions (Rload becomes larger) and towards a higher frequency under heavy load conditions. As can be seen from equation (4), the location of zero ZA will move towards a lower frequency for larger values of the equivalent resistance Resr. Pole PA is determined by amplifier GA and transistor MA as can be seen by equation (2) and thus does not shift with changes in the load. Under light load conditions, when Rload is large, pole PA, sometimes referred to as the load pole, will move towards fixed pole PB. The two poles will combine to create a phase shift which will reduce the stability of the circuit under light load conditions. The phase shift is offset by the presence of zero ZA which thereby tends to maintain stability. However, in order to locate zero ZA near fixed pole PB, the value of Resr must be maintained at a relatively high value. Unfortunately, resort must be made to expensive tantalum capacitors having high values of Resr in order to force the zero ZA to be located at the desired low frequency.

A buffer stage has been added to prior art circuits, intermediate the amplifier Ga output, and output transistor MA. This operates to reduce effective the output impedance of the transconductance amplifier so that pole PB will be shifted to a higher frequency as indicated by equation (3) above. This eliminates the no/low load instability problems previously noted. However, under heavy load conditions load pole PA will shift upwards in frequency and approach pole PB. This will again produce instability problems.

There is a need for an amplifier circuit used in CMOS low voltage drop out circuits and the like which is capable of operating under light load conditions and which avoids the necessity of using high cost tantalum capacitors. The subject invention overcomes the above-noted shortcomings of the prior art. This and other advantages of disclosed circuit and related compensation system will become apparent to those skilled in the art upon a reading of the following Detailed Description of the Invention together with the drawings.

SUMMARY OF THE INVENTION

An amplifier circuit with adaptive frequency compensation is disclosed. The circuit includes a differential amplifier having a differential input and an output and drive circuitry for driving an amplifier circuit output in response to the differential amplifier output. Frequency compensation circuitry is provided to control the frequency response of the amplifier circuit. The frequency compensation circuitry is switchable between a low current mode and a high current mode, with the frequency compensation circuitry in the low current mode producing a frequency response having a first pole located at a first frequency and with the frequency compensation circuitry in the high current mode producing the first pole located at the first frequency and a first zero at a second frequency sufficiently close to the first frequency so as to frequency stabilize the amplifier circuit, with the first zero being absent from the frequency response in the low current mode. In addition, control circuitry is provided to switch the frequency compensation circuitry between the low and high current mode in response to a load connected to the amplifier circuit output.

DESCRIPTION DETAILED OF THE INVENTION

Figure 3:
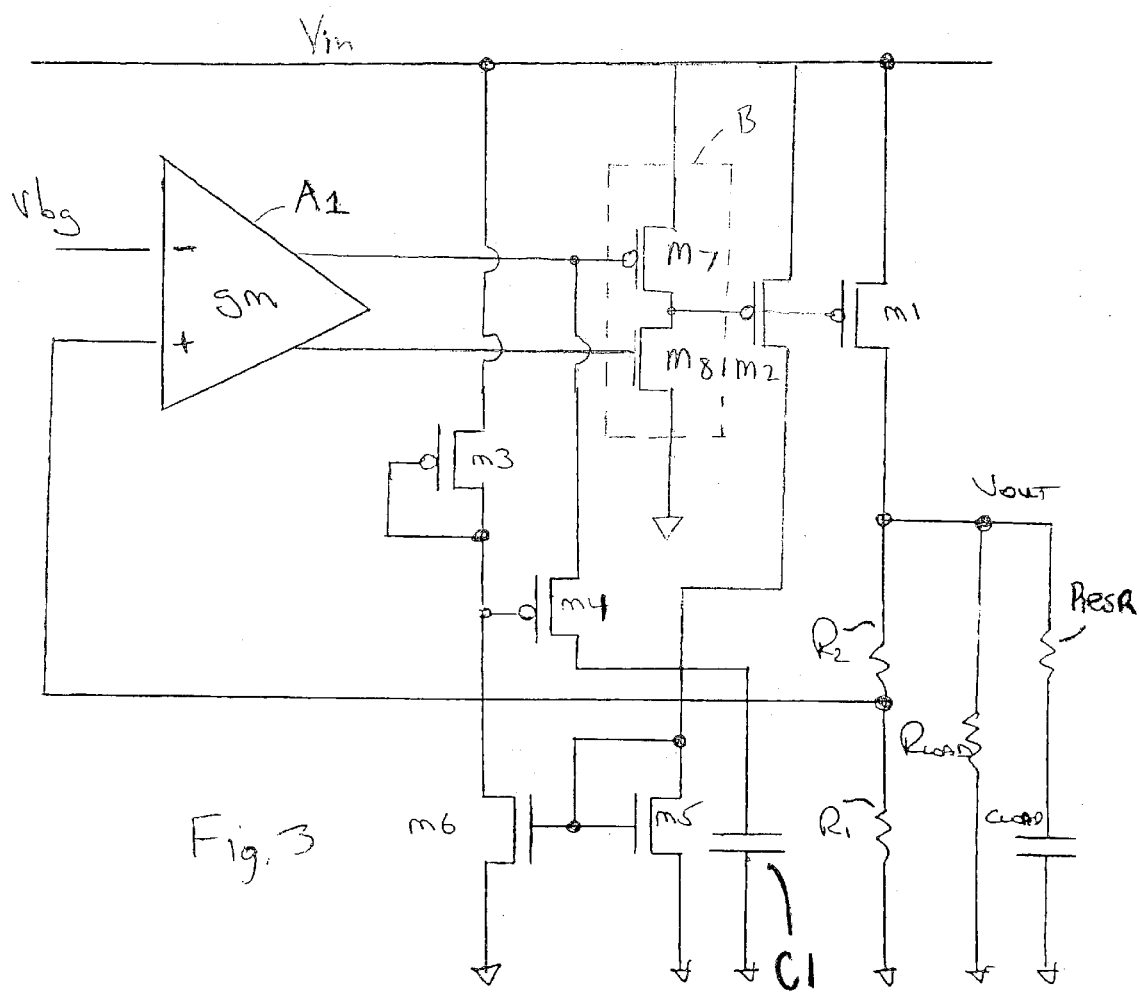
FIG. 3 is a schematic diagram of a CMOS low voltage dropout (LDO) voltage regulator implemented in accordance with the present invention.

Referring again to the drawings, FIG. 3 is a schematic diagram of a CMOS low dropout voltage (LDO) circuit 12 implemented in accordance with one embodiment of the present invention. Circuit 12 includes a tansconductance amplifier A1 which receives reference voltage Vbg at the inverting input and produces a differential output. A buffer circuit B comprising transistors M7 and M8 is disposed intermediate the amplifier Al output and the gate of a P channel transistor M1. The buffer circuit B includes a P channel transistor M7 connected to one polarity of the amplifier A1 output and, with an N channel transistor connected to the other polarity of the amplifier output. Transistor M1 functions as the regulator series pass device.

The source of transistor M1 is connected to the regulator input voltage Vin and the drain is connected to the series-connected resistors R1 and R2. The node intermediate resistors R1 and R2 is fed back to the non-inverting input of amplifier A1. Thus, the voltage at the intermediate node is maintained at voltage Vbg. Voltage Vout at the regulator output is thus determined in a manner similar to the FIG. 1 circuit and is as follows:

$$Vout = Vbg\left(1 + \frac{R2}{R1}\right) \quad (5)$$

The buffer circuit B output is also connected to the gate of a second P channel transistor M2, with the source of M2 being connected to the regulator input Vin. The drain of transistor M2 is connected to the gate/drain of a diode-connected N channel transistor M5. The source of transistor M5 is connected to the circuit common. Transistor M5 operates as the input side of a current mirror circuit with another N channel transistor M6 functioning as the output side of the current mirror circuit.

The drain of current mirror transistor M6 is connected to the gate/drain of diode connected P channel transistor M3, with the source of transistor M3 connected to the regulator input Vin. The gate/drain of transistor M3 is also connected to the gate of a P channel transistor M4, with the drain of M4 connected to the circuit common by way of a filter capacitor C1. The source of transistor M4 is connected to one of the amplifier outputs.

Figure 2:
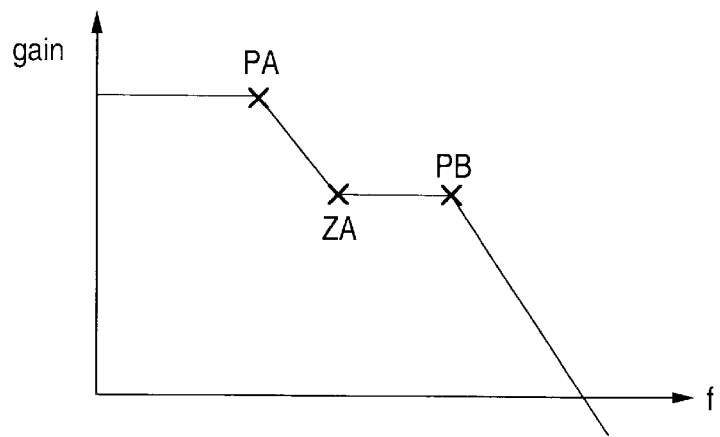
FIG. 2 is a frequency gain diagram showing the dominant poles and zero of the conventional circuit of FIG. 1.

The FIG. 2 circuit operates in two modes of operation, including a light current load mode and a relatively high current load mode. As will be explained, the circuit frequency compensation is adaptive and is altered based upon the load conditions of the circuit.

Light Load Conditions

Under light load conditions, including essentially not load conditions, current flow through series pass transistor M1 is small so that the gate-source voltage of M1 is also small. Series pass transistor M1 is a power MOS device and is very large as compared to the other transistors, including transistor M2. Thus, the gate-source voltage of M1 for relatively low currents will be relatively small compared to that of transistor M2 for the'same current. Since the gate-source voltages of transistors M1 and M2 are the same, transistor M2 can be considered non-conductive for zero or small load currents. Thus, the current through input current mirror transistor M5 is zero as is current through output current mirror transistor M6 and transistor M3. The gate voltage of transistor M4 will be equal to the input voltage Vin less the threshold voltage of transistor M3. The source voltage of transistor M4 will be equal to the input voltage Vin less the gate-source voltage of transistors M1 and M2. Thus, the gate-source voltage of transistor M4 will be less than the threshold voltage so that transistor M4 will be off. As will be further described, the gate capacitance of transistor M4 and the resistance of transistor M3 form a pole/zero pair under higher load conditions. However, under low or no load conditions when transistors M3 and M4 are off, these transistors have no effect.

Figure 1:
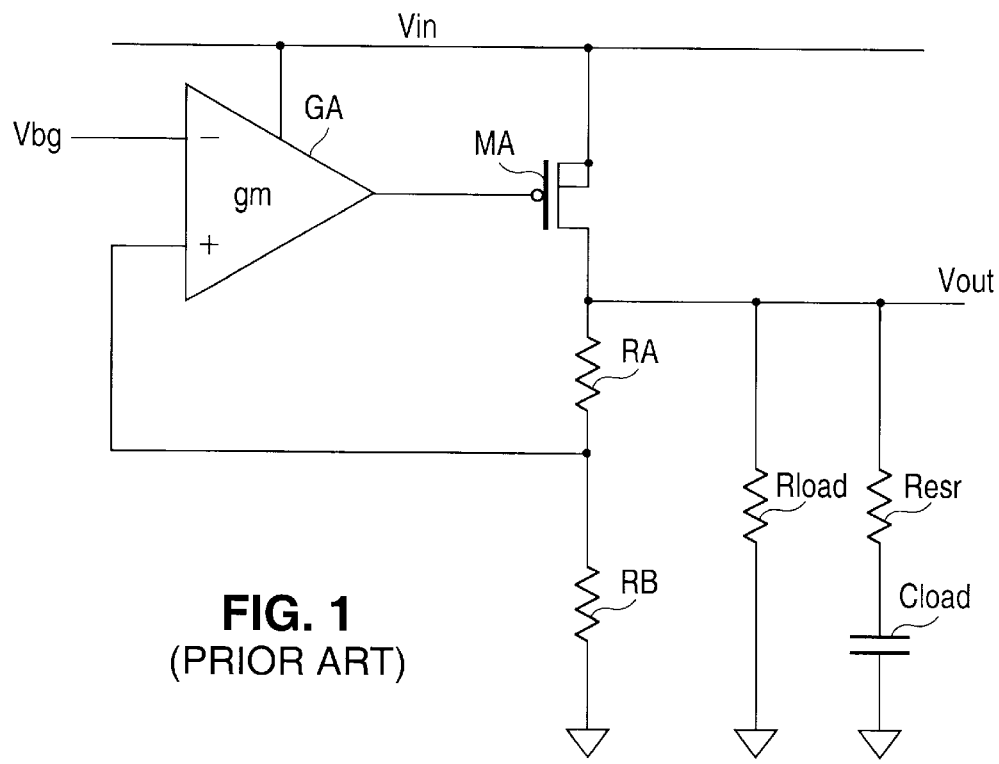
FIG. 1 is a simplifier schematic diagram of a conventional CMOS low voltage dropout (LDO) voltage regulator.

As was the case with the FIG. 1 circuit, load resistor Rload and load capacitor Cload create a load pole P1 as follows:

$$P1 = \frac{1}{(2\pi RloadCload)} \quad (6)$$

Assuming, for example, the value of Rload is 30 kΩ, a light load, and the value of Cload is 1 μF, equation (6) indicates that pole P1 will be located at 5.3 Hz.

The load capacitor Cload is implemented using a low cost ceramic device having a low equivalent resistance Resr. A zero Z1 will be produced located as follows:

$$Z1 = \frac{1}{(2\pi ResrCload)} \quad (7)$$

Assuming the Resr is small, zero Z1 will be located at a relatively high frequency, typically greater than 100 kHz.

A second pole P2 will be created by the large power MOS transistor M1 together with the output impedance of the buffer circuit B formed by transistors M7 and M8. Pole P2 can be expressed as follows:

$$P2 = \frac{1}{(2\pi RBoutCgatem1)} \quad (8)$$

The output impedance RBout of the buffer circuit B is typically 200 kΩ. Assuming that the large power MOS transistor M1 is operating in the saturation region, the gate capacitance may be as large as 37 pF. Thus, as indicated by equation (8), pole P2 created by output transistor M1 will be at 22 KHz. The location of poles P1 and P2 are set forth below in Table 1.

TABLE 1

|  | No/Light Load |
| --- | --- |
| P1 | 5.3 Hz |
| Z1 | >100 kHz |
| P2 | 22 kHz |

Given the substantial spacing between poles P1 and P2, the FIG. 3 circuit will remain stable at low and no load conditions without the presence of a nearby zero created by the equivalent series resistance Resr of the output capacitor. Thus, it is possible to use a low cost ceramic capacitor having a small value of Resr so that the zero is located at a relatively high frequency and still maintain stability at light and no load conditions.

High Load Conditions

Under relatively high load conditions, with Rload being at 18Ω, for example, the gate-source voltage of output transistor M1 will increase thereby turning on transistor M2. The current flow through M2 will be mirrored by transistors M5 and M6 thereby lowering the gate voltage of transistor M4 so as to turn on transistor M4. As will be explained, conductive transistors M3 and M4 will operate to introduce a pole/zero pair.

Under these conditions, the output impedance Rout of the buffer circuit B together with the gate capacitance Cgatem1 of power transistor M1 will produce Pole P2 described by equation (8) above. P2 will remain located at 22 kHz. Load pole P1 will move from 5.3 Hz to around 9 kHz for a load resistance of 18Ω as indicated by equation (6). A new pole P3 will be produced by the combination of the amplifier A1 output impedance RAout and the gate capacitance Cgatem4 of transistor M4.

Pole P3 is expressed as follows:

$$P3 = \frac{1}{(2\pi RAout Cgatem4)} \quad (9)$$

For a typical value of Cgatem4 of 46 pF and RAout of 6 Megohms, P3 will be located at 580 Hz.

The resistance 1/gmm3 of conductive transistor M3 together with the gate capacitance Cgatem4 of conductive transistor M4 operate to form a zero Z2 as follows:

$$Z2 = \frac{1}{\left[2\pi\left(\frac{1}{gmm3}\right) Cgatem4\right]} \quad (10)$$

Assuming that gmm3 is 1/(100 kΩ) and Cgatem4 is 46 pF, internally generated zero Z2 is thus located at 34 kHz.

TABLE 2

| Heavy Load | |
|---|---|
| P1 | 9 Hz |
| P2 | 22 kHz |
| Z2 | 34 kHz |
| P3 | 580 Hz |
| Z1 | >100 kHz |

As can be seen from Table 2, internally generated zero Z2 is advantageously located near (or after) pole P2 and tends to cancel the effects of the pole. As a consequence, the FIG. 3 circuit again operates approximately as a two pole system.

Thus, a regulator circuit has been disclosed utilizing and adaptive compensation technique and method which retains stability while using low cost ceramic capacitors having a low Resr. While one embodiment of a circuit utilizing the present invention has been disclosed in some detail, it is to be understood that certain changes can be made by those skilled in the art without departing from the spirit and scope of the invention as defined by the appended claims.

What is claimed is:

1. An amplifier circuit comprising:

a differential amplifier which includes a differential input and an output;

drive circuitry for driving an amplifier circuit output in response to the differential amplifier output; frequency compensation circuitry configured to control a frequency response of the amplifier circuit, said frequency compensation circuitry switchable between a low current mode and a high current mode, with said frequency compensation circuitry in the low current mode producing a frequency response having a first pole located at a first frequency and with said frequency compensation circuitry in the high current mode producing the first pole located at the first frequency and a first zero at a second frequency sufficiently close to the first frequency so as to frequency stabilize the amplifier circuit, with the first zero being absent from the frequency response in the low current mode; and control circuitry configured to switch the frequency compensation circuitry between the low and high current mode in response to a magnitude of current provided to a load connected to the amplifier circuit output.

2. The amplifier circuit of claim 1 wherein the drive circuitry includes a transistor having an associated capacitance which contributes to the first pole.

3. The amplifier circuit of claim 1 wherein the frequency compensation circuitry includes a first transistor having an associated capacitance which contributes to the first zero when the first transistor is in a relatively high conduction state in the high current mode, with the first transistor being in a relatively low conduction state in the low current mode.

4. The amplifier circuit of claim 3 wherein the frequency compensation circuitry includes a second transistor having an associated impedance which contributes to the first zero when the second transistor is in a relatively high conduction state in the high current mode and is in a relatively low conduction state in the low current mode.

5. The amplifier circuit of claim 4 wherein the first and second transistors are interconnected such that the capacitance associated with the first transistor is connected in series with the impedance associated with the second transistor.

6. The amplifier of claim 5 further including a load capacitor coupled to the amplifier circuit output, with the load capacitor having an equivalent series resistance which is less than 5 kohm.

* * * * *